US007480609B1

(12) United States Patent
Cavanagh et al.

(10) Patent No.: US 7,480,609 B1
(45) Date of Patent: Jan. 20, 2009

(54) APPLYING DISTRIBUTED SIMULATION TECHNIQUES TO HARDWARE EMULATION

(75) Inventors: Carl Cavanagh, Oakland, CA (US); Steven A. Sivier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 557 days.

(21) Appl. No.: 11/047,148

(22) Filed: Jan. 31, 2005

(51) Int. Cl.
  *G06F 9/465* (2006.01)
  *G06F 17/50* (2006.01)
  *G06F 9/44* (2006.01)

(52) U.S. Cl. .................. 703/23; 703/16; 703/17; 703/20

(58) Field of Classification Search .............. 703/13, 703/14, 16, 17, 20, 23
See application file for complete search history.

(56) References Cited

U.S. PATENT DOCUMENTS

| 4,456,994 | A | 6/1984 | Segarra |
| 4,821,173 | A | 4/1989 | Young et al. |
| 4,937,173 | A | 6/1990 | Kanda et al. |
| 5,185,865 | A | 2/1993 | Pugh |
| 5,327,361 | A | 7/1994 | Long et al. |
| 5,339,435 | A | 8/1994 | Lubkin et al. |
| 5,398,317 | A | 3/1995 | Nugent |
| 5,442,772 | A | 8/1995 | Childs et al. |
| 5,455,928 | A | 10/1995 | Herlitz |
| 5,519,848 | A | 5/1996 | Wloka et al. |
| 5,625,580 | A | 4/1997 | Read et al. |
| 5,634,010 | A | 5/1997 | Ciscon et al. |
| 5,715,184 | A | 2/1998 | Tyler et al. |
| 5,732,247 | A | 3/1998 | Dearth et al. |
| 5,751,941 | A | 5/1998 | Hinds et al. |
| 5,794,005 | A | 8/1998 | Steinman |
| 5,812,824 | A | 9/1998 | Dearth et al. |
| 5,838,948 | A * | 11/1998 | Bunza ................ 703/27 |
| 5,848,236 | A | 12/1998 | Dearth et al. |
| 5,850,345 | A | 12/1998 | Son |

(Continued)

OTHER PUBLICATIONS

"Rule Base Driven Conversion of an Object Oriented Design Structure Into Standard Hardware Description Languages," Verschueren, A.C., IEEE Xplore, appears in Euromicro Conference, 1998, Proceedings. 24th, vol. 1, Aug. 25, 1998, pp. 42-45.

(Continued)

*Primary Examiner*—Paul L Rodriguez
*Assistant Examiner*—Juan C Ochoa
(74) *Attorney, Agent, or Firm*—Meyertons Hood Kivlin Kowert & Goetzel, P.C.; B. Nöel Kivlin

(57) ABSTRACT

A system for applying distributed software simulation techniques to hardware emulation may include a first hardware emulator mounted on a first expansion board at a first host, and a second hardware emulator mounted on a second expansion board at a second host. The first hardware emulator may be configured to emulate a first portion of a system under test, and the second hardware emulator may be configured to emulate a second portion of the system under test, and the first and second hardware emulators may coordinate an emulation of the system under test using one or more messages, i.e., a coordination of an emulation of the system under test may be accomplished using communications between the first and second hardware emulators.

19 Claims, 6 Drawing Sheets

U.S. PATENT DOCUMENTS

| | | | |
|---|---|---|---|
| 5,870,585 | A | 2/1999 | Stapleton |
| 5,875,179 | A | 2/1999 | Tikalsky |
| 5,881,267 | A | 3/1999 | Dearth et al. |
| 5,892,957 | A | 4/1999 | Normoyle et al. |
| 5,907,685 | A | 5/1999 | Douceur |
| 5,907,695 | A | 5/1999 | Dearth |
| 5,910,903 | A | 6/1999 | Feinberg et al. |
| 5,991,533 | A | 11/1999 | Sano et al. |
| 6,031,987 | A | 2/2000 | Damani et al. |
| 6,053,947 | A | 4/2000 | Parson |
| 6,117,181 | A | 9/2000 | Dearth et al. |
| 6,134,234 | A | 10/2000 | Kapanen |
| 6,345,242 | B1 | 2/2002 | Dearth et al. |
| 6,507,809 | B1 | 1/2003 | Yoshino et al. |
| 6,675,334 | B2 | 1/2004 | Wadley |
| 6,711,411 | B1 | 3/2004 | Ruffini |
| 6,732,068 | B2 | 5/2004 | Sample et al. |
| 6,748,451 | B2 | 6/2004 | Woods et al. |
| 6,810,442 | B1 * | 10/2004 | Lin et al. .................. 710/22 |
| 2003/0093252 | A1 | 5/2003 | Frankel |
| 2003/0093253 | A1 | 5/2003 | Freyensee |
| 2003/0093254 | A1 * | 5/2003 | Frankel et al. ............. 703/13 |
| 2003/0093255 | A1 | 5/2003 | Freyensee |
| 2003/0093256 | A1 | 5/2003 | Cavanagh |
| 2003/0093257 | A1 | 5/2003 | Cavanagh |
| 2003/0093569 | A1 | 5/2003 | Sivier |
| 2003/0229486 | A1 * | 12/2003 | Ito ........................... 703/27 |

OTHER PUBLICATIONS

"Modeling Communication with Objective VHDL," Putzke, et al., IEEE Xplore, appears in Verilog HDL Conference and VHDL International Use Forum, 1998, IVC/VIUF, Proceedings., 1998 International, Mar. 16, 1998, pp. 83-89.

"A Procedural Language Interface for VHDL and its Typical Applications," Martinolle, et al., IEEE Xplore, appears in Verilog HDL Conference and VHDL International Use Forum, 1998, IVC/VIUF, Proceedings, 1998, International, Mar. 16, 1998, pp. 32-38.

"Verilog Procedural Interface for the, Verilog Hardware Description Language,"Dawson, et al., IEEE Xplore, appears in Verilog HDL Conference, 1996, Proceedings., 1996 International, Feb. 26, 1996 pp. 17-23.

"An Integrated Environment for HDL Verification,"York, et al., IEEE Xplore, appears in Verilog HDL Conference, 1995, Proceedings., 1995 International, Mar. 27, 1995, pp. 9-18.

"The PowerPC 603 C++ Verilog Interface Model," Voith, R.P., IEEE Xplore, appears in Compcon Spring '94, Digest of Papters, Feb. 28, 1994, pp. 337-340.

Networked Object Oriented Verification with C++ at Verilog, Dearth, et al., IEEE, XP-002144328, 1998, 4 pages.

Patent Abstracts of Japan, publication No. 10326835, published Dec. 8, 1998.

Patent Abstracts of Japan, publication No. 10049560, published Feb. 20, 1998.

Patent Abstracts of Japan, publication No. 10340283, published Dec. 22, 1998.

Patent Abstracts of Japan, publication No. 07254008, published Oct. 3, 1995.

"Multiprocessing Verilog Simulator Exploits the Parallel Nature of HDLs." Lisa Maliniak, Electronic Design Abstract, May 30, 1994, 1 page.

"It's A Multithreaded World, Part I," Charles J. Northrup, BYTE, May 1992, 7 pages.

"It's a Multithreaded World, Part 2," Charles J. Northrup, BYTE, Jun. 1992, pp. 351-356.

"Weaving a Thread," Shashi Prasad, BYTE, Oct. 1995, pp. 173-174.

"Making Sense of Collaborative Computing," Mark Gobbs, Network World Collaboration, Jan. 10, 1994, 4 pages.

"Parallel Logic Simulation of VLSI Systems,"Bailey, et al., ACM Computing Surveys, vol. 26, No. 3, Sep. 1994, pp. 255-294.

"Multithreaded Languages for Scientific and Technical Computing," Cherri M. Pancake, Proceedings of the IEEE, vol. 81, No. 2, Feb. 1993, pp. 288-304.

"Distributed Simulation Architecture, SW Environment, Enterprise Server Products," Purdue EE400 Presentation by Freyensee and Frankel, Nov. 9, 2000, 13 pages.

"BNF and EBNF: What Are They And How Do They Work?," Lars Marius Garshol, Oct. 12, 1999, pp. 1-10.

"VCK: Verilog-C Kernel," Testbench Automation, Distributed by Verilog Simulation, Hardware-Software Co-verification, 2001 Avery Design Systems, Inc., 8 pages.

"Principles of Verilog PLI," Swapnajit Mittra, Silicon Graphics Incorporated, 1999, 10 pages.

"IEEE Standard Hardware Description Language Based on the Verilog® Hardware Description Language," IEEE, Dec. 12, 1995, 8 pages.

"Open Vera 1.0, Language Reference Manual," Version 1.0, Mar. 2001, pp. 4-1 to 4-34, pp. 5-1 to 5-32, 6-1 to 6-22, 7-1 to 7-24, 11-1 to 11-50, 12-1 to 12-8, 13-1 to 13-14, 14-1 to 14-20, 15-1 to 15-118.

"VLSI Designe of a Bus Arbitration Module for the 68000 Series of Microprocessors," Ososanya, et al., IEEE, 1994, pp. 398-402.

"A VHDL Standard Package for Logic Modeling," David R. Coelho, IEEE Design & Test of Computers, vol. 7, Issue 3, Jun. 1990, pp. 25-32.

"Corrected Settling Time of the Distributed Parallel Arbiter," M.M. Taub, PhD., IEEE Proceedings, Part E: Computers & Digitals, vol. 139, Issue 4, Jul. 1992, pp. 348-354.

"Quickturn Unveils Emulation and Prototyping Products," Worldwide Videotex, vol. 13, Issue 7, p. 1-5, Jul. 1, 2000.

"Extreme-II," Verisity Ltd., pp. 2, 2004.

"New Palladium II Extends Cadence Acceleration/Emulation Leadership," Hehir, Kristin, Cadence Design Systems, Inc., pp. 2, Oct. 25, 2004.

"iProve AMBA Design Toolkit," Dynalith Systems, pp. 2, Sep. 6, 2004.

"iProve Intelligent PROtotype Verification Engine," Dynalith Systems Co., Ltd., pp. 2, 2001-2004.

* cited by examiner

APPLYING DISTRIBUTED SIMULATION TECHNIQUES TO HARDWARE EMULATION

BACKGROUND OF THE INVENTION

1. Field of the Invention

This invention relates to the field of computer systems and, more particularly, to distributed hardware emulation environments.

2. Description of the Related Art

Generally, the development of components for an electronic system such as a computer system includes design verification of the components, which may be accomplished, for example, by simulation of models of the components, or by hardware emulation of the components. During design verification, the specified functions of each component may be tested and, when incorrect operation (a bug) is detected, the model or emulation circuitry of the component may be changed to generate correct operation. Once design verification is complete, the component may be fabricated. Since many of the bugs may have been detected in design verification, the component may be more likely to operate as specified and the number of revisions to hardware may be reduced. Simulation models are frequently described in a hardware description language (HDL) such as Verilog, VHDL, etc.

Originally, simulations of electronic systems were performed on a single computing system. However, as the electronic systems (and the components forming systems) have grown larger and more complex, single-system simulation has become less desirable. The speed of the simulation (in cycles of the electronic system per second) may be reduced due to the larger number of gates in the model which require evaluation. Additionally, the speed may be reduced as the size of the electronic system model and the computer code to perform the simulation may exceed the memory capacity of the single system. In some cases, the simulators may not be capable of simulating the entire model. As the speed of the simulation decreases, simulation throughput is reduced.

To address these issues, distributed simulation has become more common. Generally, a distributed simulation system includes two or more computer systems (i.e. nodes) simulating portions of an electronic system in parallel. Furthermore, each node must communicate with other nodes to transfer information between different simulated portions of the electronic system, i.e., to coordinate and/or synchronize steps of the distributed simulation. For example, a distributed simulation system may sample output signals from the portions of the system simulated by each node and communicate the corresponding signal values to other nodes. The received signal values are then driven as inputs to the models in those other nodes.

Hardware emulation has typically been performed using expensive, often proprietary emulation servers that may contain custom-built hardware emulation devices. Such emulation servers may, for example, be limited to using a maximum number of emulation devices such as field programmable gate arrays (FPGAs) that may be incorporated within the proprietary design of the emulation server. Hardware emulation for a given component may typically be accomplished faster than a software simulation for the same component. For large and complex designs, however, the total amount of design verification required may exceed the emulation capacity supported by an emulation server. A technique that allows flexible configuration of hardware emulation capacity (e.g., using inexpensive commodity hardware), and uses inter-node communication to coordinate distributed hardware emulation in a manner similar to the coordination techniques used in distributed software simulation, may therefore be desirable.

SUMMARY

Various embodiments of systems and methods for applying distributed software simulation techniques to hardware emulation are disclosed. According to a first embodiment, the system may include a first hardware emulator mounted on a first expansion board at a first host, and a second hardware emulator mounted on a second expansion board at a second host. The first hardware emulator may be configured to emulate a first portion of a system under test, and the second hardware emulator may be configured to emulate a second portion of the system under test, and the first and second hardware emulators may coordinate an emulation of the system under test using one or more messages, i.e., a coordination of an emulation of the system under test may be accomplished using communications between the first and second hardware emulators. By using expansion boards for the hardware emulators, and allowing multiple emulators spread over multiple hosts to coordinate distributed emulation, a flexible and inexpensive mechanism for hardware emulation of large or complex electronic systems may be implemented.

According to a second embodiment, the system may include one or more additional hardware emulators at the first host. Each additional hardware emulator may be configured to emulate a respective additional portion of the system under test, and to coordinate an emulation of the system under test with the first and second hardware emulators using one or more additional messages. Thus, multiple hardware emulators may be incorporated within a single host, and may be configured to cooperate with each other and/or with other hardware emulators at other hosts to emulate the system under test. While in some embodiments, each hardware emulator may be mounted at its own exclusive expansion board, in other embodiments a single expansion board may be shared by multiple hardware emulators.

According to one embodiment, an expansion board used for a hardware emulator may be a Peripheral Component Interconnect (PCI) board, and communication between hardware emulators may utilize a PCI bus and associated PCI interfaces. A hardware emulator may include a field programmable gate array (FPGA) device in one embodiment, and may also include a complex programmable logic device (CPLD) operable to program the FPGA. The FPGA may include numerous logic blocks, including a control logic block configured to map physical signals to logical signals, and logical signals to physical signals. For example, the control logic block may map a physical representation of an output signal from an emulated portion of the system under test to a logical representation of the output signal for transmittal to another hardware emulator. The control logic block may also include a formatter to format outgoing messages according to a grammar, and a parser to parse incoming messages according to the grammar. The FPGA device may also include a drive logic block configured to drive an input signal of an emulation portion of the system under test, and a sample logic block configured to sample an output signal of the emulated portion of the system under test.

In one embodiment, the system may also include a distributed emulation controller, configured to distribute the respective portions of the system under test to various hardware emulators, and to supervise, control and monitor the emulation of the system under test. In another embodiment, the system may also include a hub configured to route messages (such as messages containing output signals from the various hardware emulators, as well as other commands) among hardware emulators and between hardware emulators and a distributed emulation controller.

Figure 1:
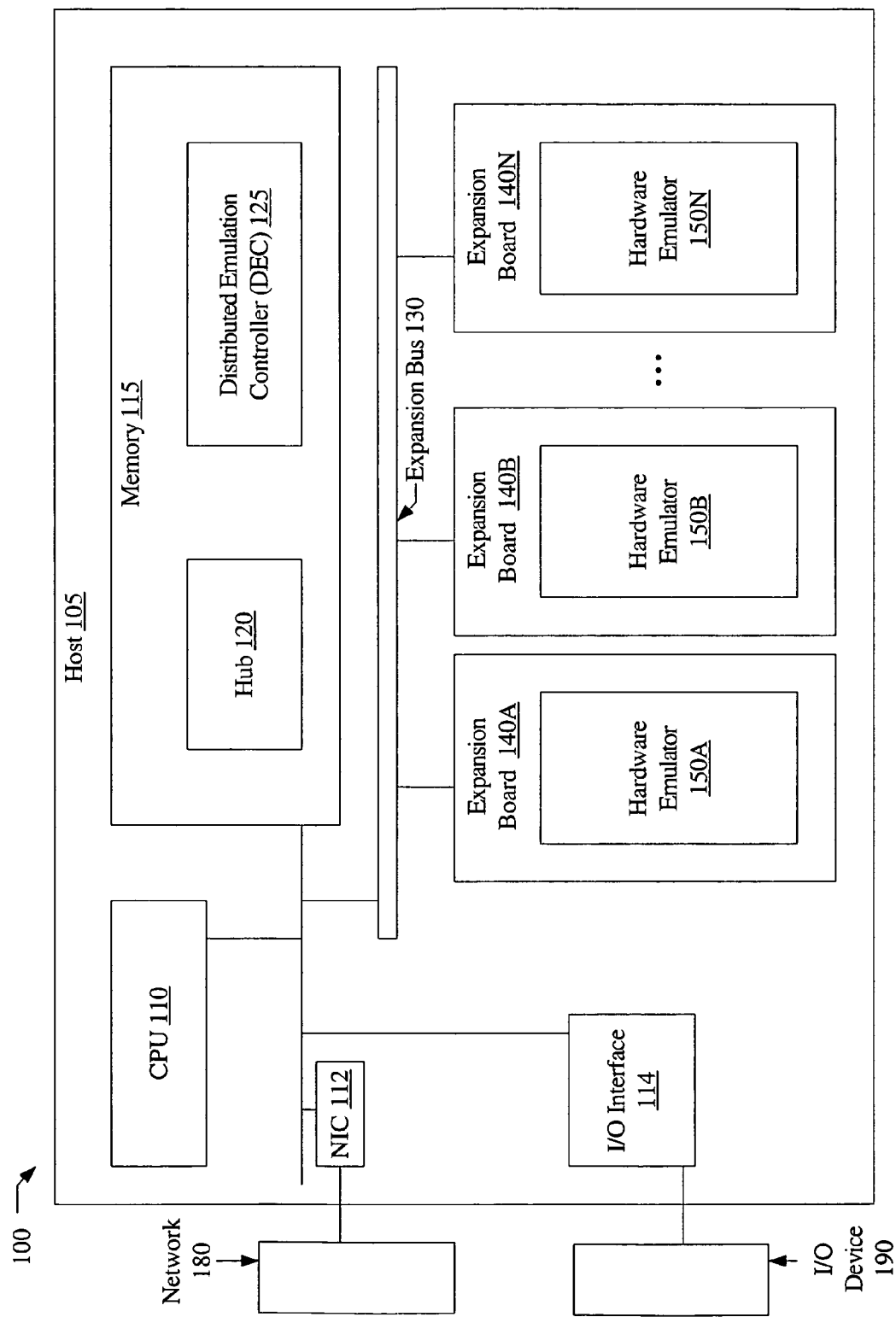
FIG. 1 is a block diagram of one embodiment of a distributed design verification system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION OF EMBODIMENTS

FIG. 1 is a block diagram of one embodiment of a distributed design verification system 100. In the embodiment of FIG. 1, the distributed design verification system (DDVS) 100 includes host 105, comprising a central processing unit (CPU) 110, memory 115, an expansion bus 130 and a plurality of expansion boards 140A-140N (which may be referred to herein as expansion boards 140) linked to the expansion bus 130. As used herein, an expansion board is defined as a printed circuit board that may be inserted into a computer host (e.g., using expansion slots) to provide or enhance a specific capability. Each expansion board 140 may include a respective hardware emulator 150—e.g., hardware emulator 150A may be mounted on expansion board 140A, hardware emulator 150B may be mounted on expansion board 140B, etc. In the depicted embodiment, memory 115 may include a hub 120 and a distributed emulation controller (DEC) 125. That is, hub 120 and DEC 125 may each comprise software instructions that may be resident within memory 115. In addition, host 105 may include a network interface card (NIC) 112 providing an interface to a network 180, and an input/output (I/O) interface card 114 providing an interface to an I/O device 190. It is noted that while the depicted embodiment includes only a single CPU 110, a single NIC 112 and a single I/O interface 114, multiple CPUs, NICs and/or I/O interfaces may be included within a host 105 in other embodiments.

Distributed design verification system 100 may be operable to verify the design of an electronic system, such as a computer system other than system 100, by partitioning the electronic system into a plurality of portions, distributing each portion to a respective hardware emulator 150, and emulating the respective portion at hardware emulator 150. Coordination of emulation of the various portions of the electronic system may be accomplished by communication (i.e., sending and receiving messages) between the different hardware emulators 150, as well as between the hardware emulators 150 and distributed emulation controller 125. For example, output signals generated at a first emulated portion of the electronic system at one hardware emulator 150 may be sent in the form of one or more messages to another hardware emulator, and used to drive input signals at a second emulated portion of the electronic system. The distributed emulation controller 125 may also be configured to supervise the hardware emulation of the distributed portions (e.g., start and stop the emulation at the various hardware emulators in a synchronized manner, coordinate timestep emulation as described below, monitor the state of hardware emulators 150, etc.), and hub 120 may be used to manage and route messages between DEC 125 and hardware emulators 150. The electronic system whose design is being verified may be referred to herein as a "system under test" (SUT). A system under test representing a multiprocessor computer system may include, for example, multiple CPUs, numerous application-specific integrated circuits (ASICs), and various processor boards, I/O boards, and other boards. For such a system under test, a particular CPU may be emulated on hardware emulator 150A, one or more ASICs on a hardware emulator 150B, and an I/O or processor board on another hardware emulator 150C. In one embodiment, the system under test may be a system on a chip (SOC). In some embodiments, a portion of a CPU, an ASIC or board may be emulated on a given hardware emulator 150, rather than the entire component. In other embodiments, multiple components, such as two or more ASICs, may be emulated on a given hardware emulator, as desired. Further details regarding the structure and operation of hardware emulators 150, DEC 125 and hub 120 are provided below.

Hardware emulators 150, DEC 125 and hub 120 may all be referred to as nodes of DDVS 100. Generally, a node may include the hardware and/or software resources for: (i) emulating a component or portion of the system under test; or (ii) running a test program or other code (e.g. communication routing code in the hub) for initializing, controlling or monitoring the emulation. A node may include one or more of: an expansion board, a computer system (e.g. a server or a desktop computer system), one or more processors within a computer system (and some amount of system memory allocated to the one or more processors) where other processors within the computer system may be used as another node or for some other purpose, etc. The nodes of a DDVS 100 may be interconnected using a combination of hardware and/or software components. For example, in one implementation, Unix sockets may be used to connect hub 120 and DEC 125, while Peripheral Component Interconnect (PCI) commands and a PCI bus may be used for communication between a hub 120 and a hardware emulator 150. Other embodiments may use other logical interconnections (e.g. remote procedure calls, defined application programming interfaces (APIs), shared memory, pipes, etc.) for at least part of the communication between nodes. In embodiments including multiple hosts, the physical interconnection between the nodes may vary, and the computer hosts including the nodes may be networked using any network topology and any suitable network protocol (such as TCP/IP).

Figure 2:
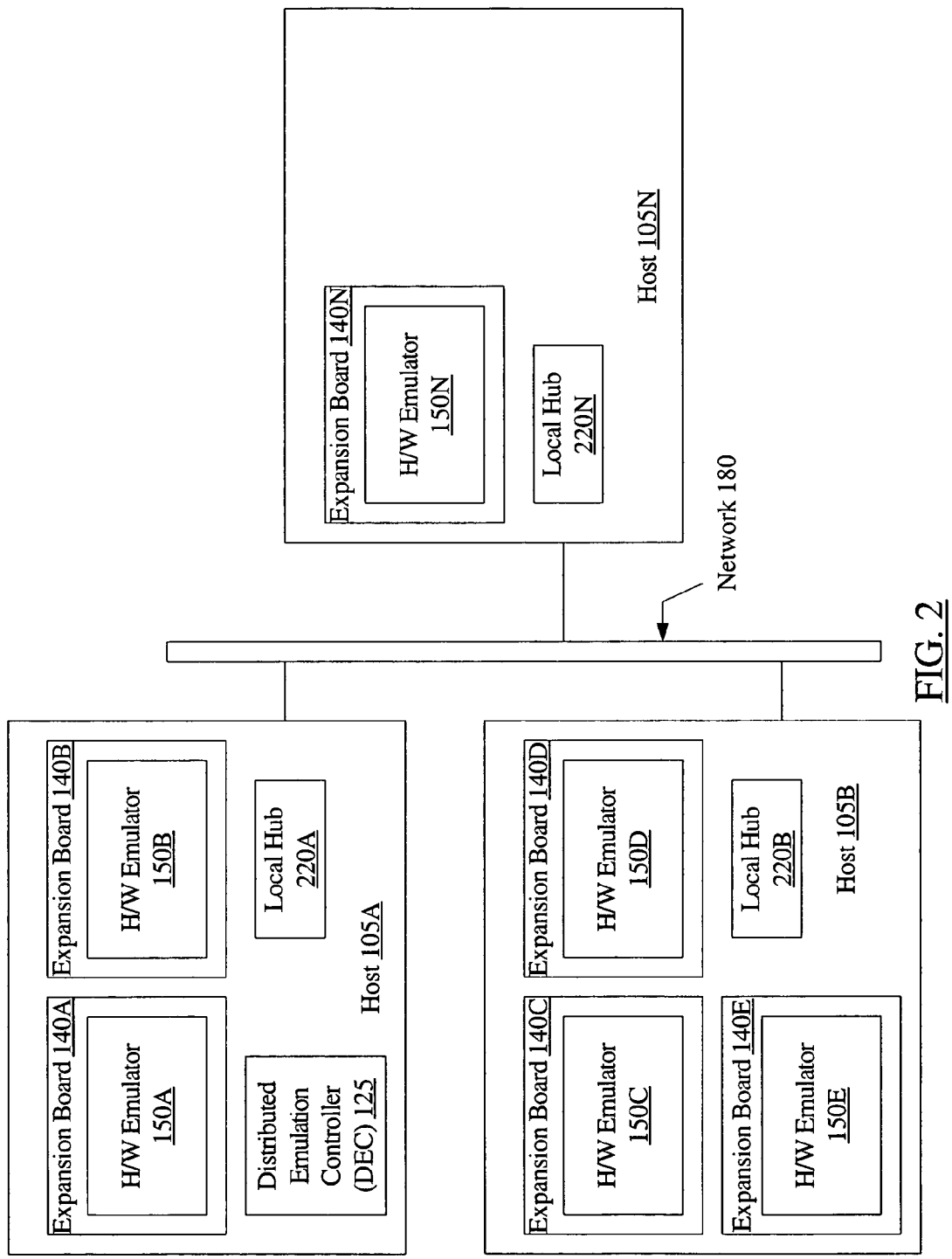
FIG. 2 is a block diagram of a second embodiment of a distributed design verification system.

FIG. 2 is a block diagram illustrating another embodiment of a distributed design verification system. According to the depicted embodiment, the system includes a plurality of hosts 105A, 105B, . . . , 105N (collectively, hosts 105) coupled to a network 180. As shown, each host 105 may include one or more expansion boards 140 with a corresponding hardware emulator 150: e.g., host 105A may include expansion board 140A and 140B (with hardware emulators 150A and 150B, respectively), host 105C may include expansion boards 140C, 140D and 140E, and host 105N may include expansion board 140N. In addition, each host 105 may include a respective local hub 220, and one of the hosts (105A in the depicted embodiment) may also include the distributed emulation controller. Local hub 220 may be configured to route messages both locally (e.g., between different hardware emulators 150 within a single host 105) as well as across hosts (e.g., between hardware emulators 150 at different hosts, and between hardware emulators at a given host and DEC 125). The various hardware emulators 150 may be configured to coordinate the emulation of the system under test by communication with each other and with the distributed emulation controller using messages, as in the embodiment depicted in FIG. 1. Each host 105 shown in FIG. 2 may also include other components such as one or more CPUs, memory, network interface cards, I/O interfaces, and one or more expansion buses, generally similar to the corresponding components shown within host 105 of FIG. 1.

Figure 3:
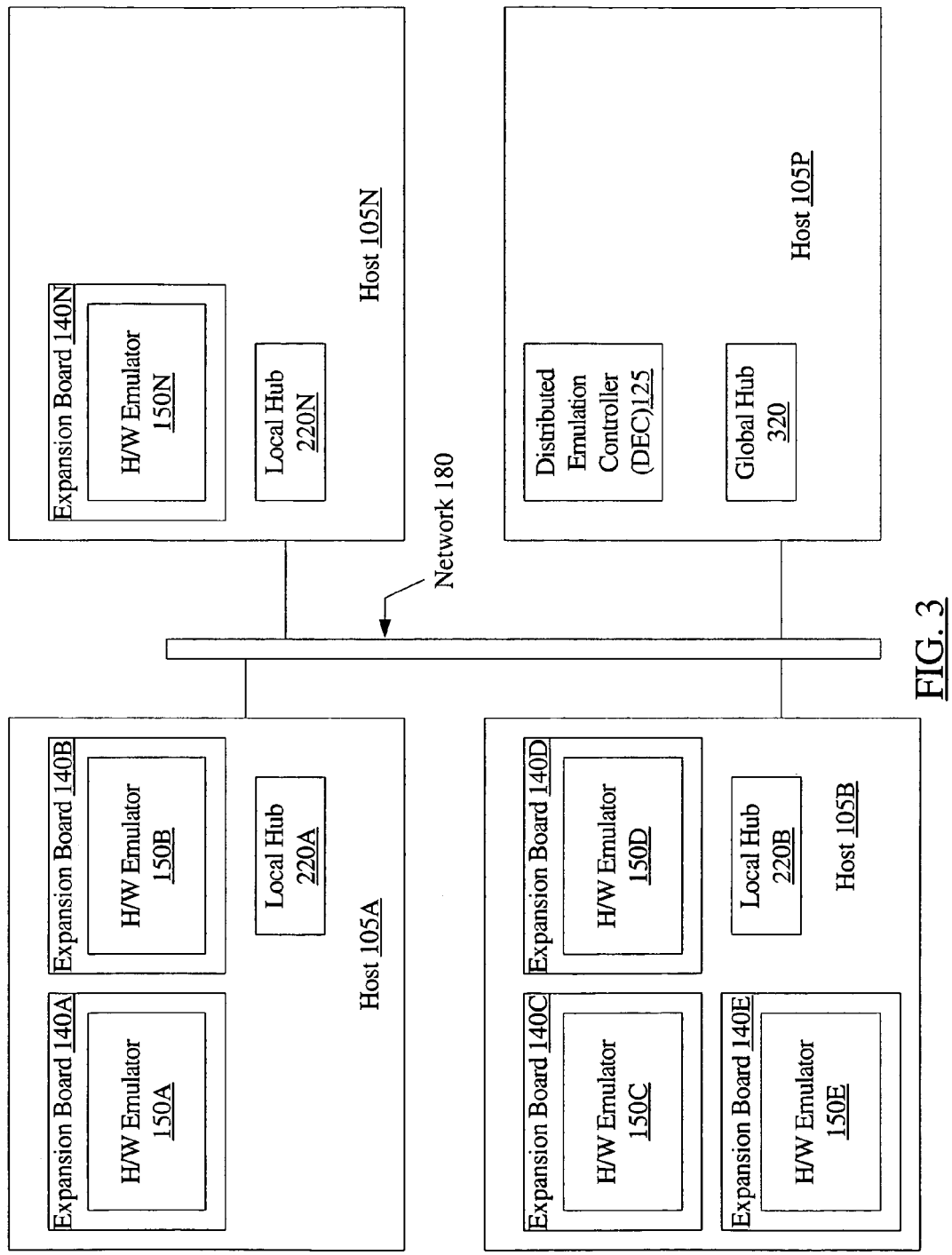
FIG. 3 is a block diagram of a third embodiment of a distributed design verification system.

FIG. 3 is a block diagram illustrating a third embodiment of a distributed design verification system. According to the third embodiment, the system includes a plurality of hosts 105A-105N, each including one or more expansion boards 140 and hardware emulators 150, and an additional host 105P including the distributed emulation controller 125. That is, host 105P may be dedicated to control functions and inter-host communication for the distributed emulation of the SUT, and may not include a local hardware emulator 150. As shown, each of the hosts containing a hardware emulator 150 (i.e., hosts 105A-105N) may also include a local hub 220, while host 105P may include a global hub 320. Global hub 320 may be configured to provide global communication services, for example to maintain routing information for all the hosts in the system (e.g., to synchronize communication between local hubs), to broadcast messages and/or commands to all nodes from DEC 125, etc. In some embodiments, global hub 320 may also be configured to maintain a log of inter-host communications related to distributed emulation. As in the embodiments depicted in FIG. 1 and FIG. 2, the various hardware emulators 150 of FIG. 3 may also be configured to coordinate the emulation of the system under test by communication with each other and with the distributed emulation controller using messages. Each host 105 (i.e., 105A-105N and 105P) shown in FIG. 3 may also include other components such as one or more CPUs, memory, network interface cards, I/O interfaces, and one or more expansion buses, generally similar to the corresponding components shown within host 105 of FIG. 1. As the functionality provided by hub 120 of FIG. 1 is generally similar to the functionality provided by local hubs 220 and global hubs 320, the generic term "hub" may be used to refer to all three types of hubs in the following description.

In each of the embodiments of distributed design verification system 100 shown in FIG. 1, FIG. 2 and FIG. 3, a given hardware emulator 150 may include one or more programmable logic devices, such as a field programmable gate array (FPGA) configured to emulate a portion of the system under test. As described below in conjunction with the description of FIG. 4, an FPGA within a given hardware emulator may comprise several logic blocks dedicated to specific emulation-related functions, such as driving input signals of the portion of the system being emulated, sampling output signals, translating physical representations of input and output signals to logical representations, communicating with other nodes and with DEC 125 over expansion bus 130, etc. A second programmable logic device, such as a complex programmable logic device (CPLD) may be used to program the FPGA, e.g., in response to commands issued from DEC 125.

DEC 125 is a node which may execute a test program or other code which is not part of the system under test, but instead may be used to control the distributed design verification process (e.g., to program CPLDs and/or FPGAs, coordinate hardware emulation being performed at other nodes), introduce some test value or values into the system under test (e.g. injecting an error on a signal), monitor the emulation for certain expected results or to log the emulation results, etc. A DEC 125 may communicate with a hardware emulator 150 to program and/or bring up the hardware emulator 150, to communicate commands to a hardware emulator 150, to request a value of a signal of the component emulated in the hardware emulator 150, to start/stop steps of the emulation, etc. It is noted that in some embodiments, multiple DECs 125 may be employed within a DDVS 100. For example, in one such embodiment, a hierarchy of DECs 125 may be used, where each individual DEC is responsible for controlling emulation at a respective subset of hardware emulators 150. In another such embodiment, two or more DECs may be configured for high availability, e.g., a standby DEC may be configured to take over from a primary DEC in the event of a failure. In a third embodiment utilizing multiple DECs, the type of functionality provided different DECs may differ: for example, a first DEC may be used for controlling normal emulation, while a second DEC may be used for logging, special types of error testing, etc.

Hub 120 may be provided for routing communications between the other nodes in the distributed design verification system 100. DEC 125 and each hardware emulator 150 may be configured to transmit message packets to the hub, which may parse the message packets and forward the message packets to the destination node or nodes for the message. Additionally, in some embodiments hub 120 may be the destination for some message packets (e.g. for synchronizing the emulation across the multiple hardware emulators 150 and DECs 125, or for messages to obtain information logged at hub 120). It is noted that in some embodiments, hardware emulators 150 and DECs 125 may be capable of sending messages directly to each other without the use of a hub 120, i.e., hub 120 may be omitted from DDVS 100 in such embodiments. In one embodiment, the functionality provided by a hub 120 may be implemented within a programmable logic device such as an FPGA. Such a programmable logic device may be dedicated entirely to implementing hub functionality in one implementation, while in other implementations the programmable logic device may also be used for other purposes, including hardware emulation of a portion of the system under test (that is, the same FPGA may be used for both hardware emulation and routing of messages to other nodes).

As mentioned above, communication between the nodes of DDVS 100 may be in the form of message packets. The format and interpretation of the message packets may be specified by a grammar implemented by the nodes. The grammar may be an extendable language comprising predefined commands for communicating between nodes, providing for command/control message packets for the emulation as well as message packets transmitting signal values (and optionally signal strength information). Message packets transmitting signal values may be referred to as signal transmission message packets, and the command in the message packet may be referred to as a transmit command. The grammar may allow for more abstract communication between the nodes, allowing for the communication to be more human-readable (and therefore capable of being stored in a log, for example, for later analysis or for recovery from failures) than the communication of only physical signals and values of those signals between the nodes. In some embodiments, the grammar being used could also be used for communication with one or more systems or hosts providing emulation of portions of the system under test. The grammar may also be used to communicate configuration information (e.g., mappings of corresponding ports at different hardware emulators), or to store configuration information in files at one or more hosts of DDVS 100. As used herein, a physical signal is a signal defined in the hardware emulation (e.g., at a hardware emulator 150) of a given component of the system under test, and a logical signal is a signal defined using the grammar. Logical signals may be mapped to physical signals (or vice versa) using one or more grammar commands.

Generally, a message packet may be any communication between nodes in the distributed design verification system. The message packet may be encoded in any format (e.g. binary, a string of characters, etc.). Each message packet may include one or more commands. In one embodiment, each message packet may comprise one command. In one specific implementation, the command may comprise a string of one or more characters comprising the name of the command, a separator character (e.g. an open brace in one embodiment, although any character may be used), an optional set of arguments, and a second separator character (e.g. a close brace in one embodiment, although any character may be used) which marks the end of the command. A transmit command may include a source hardware emulation (i.e., a portion of a system under test at a particular hardware emulator 150) as an argument, as well as a target hardware emulation and port list for the logical port or ports for which signal values are being provided. Other commands may include stop commands for pausing the emulation, start commands for resuming the emulation, a no-operation command (NOP) for emulation synchronization and replying to commands, commands for the hub to synchronize timestep transitions or clock cycles, and optionally phases in the timestep or clock cycle, etc.

Figure 4:
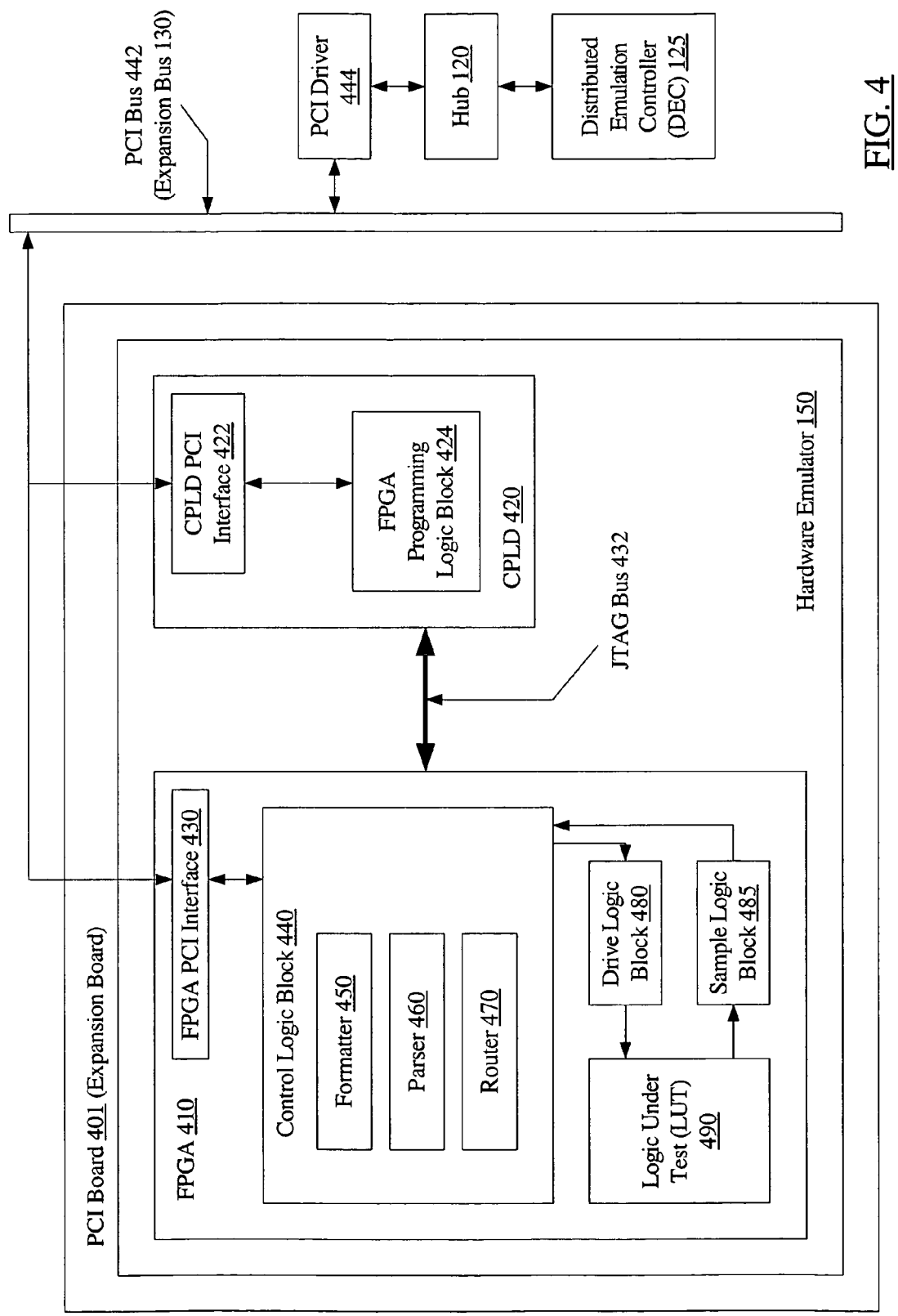
FIG. 4 is a block diagram illustrating components of a hardware emulator and associated distributed design verification nodes at a host according to one embodiment.

FIG. 4 is a block diagram illustrating components of a hardware emulator 150, and associated distributed design verification nodes at one particular host according to one embodiment. In the illustrated embodiment, hardware emulator 150 is mounted at a PCI board 401: that is, the specific expansion board 140 deployed in the depicted embodiment is a PCI board, and the expansion bus 130 is a PCI bus 442. Hardware emulator 150 may include a field programmable gate array device (FPGA) 410 and a complex programmable logic device (CPLD) 422, as described below in further detail. A given hardware emulator 150 may also be configured to communicate with distributed emulation controller (DEC) 125, hub 120, as well as with other hardware emulators (e.g., to send and/or receive messages containing information required to coordinate emulation of the system under test), over PCI bus 442 using one or more PCI interfaces such as FPGA PCI interface 430 and software PCI driver 444. Any suitable FPGA or FPGAs from any desired FPGA vendor (such as Xilinx, Altera, etc.) or combination of vendors, where the FPGA is programmable to emulate desired logic whose design is to be verified, may be used within hardware emulator 150. The configuration of different hardware emulators 150 within a DDVS 100 may differ, for example in the physical size, complexity or number of FPGAs included, the FPGA vendor or vendors, etc. Not all the slots available for expansion boards within a host 105 may be used for hardware emulation at any given time; that is, it may be possible to increase or decrease the amount or complexity of hardware emulation being performed at a host by changing the number of expansion boards and corresponding FPGAs being used.

In the embodiment illustrated in FIG. 4, FPGA 410 may include the emulated portion of the system under test (which may be termed logic under test (LUT) 490), drive logic block 480, sample logic block 485, control logic block 440, and FPGA PCI interface 430. CPLD 120 may include CPLD PCI interface 422 and FPGA programming logic block 424. In response to commands from DEC 125, FPGA programming logic block 424 may be configured to program or synthesize desired logic at FPGA 410, e.g., by issuing commands over a bus such as Joint Action Task Group (JTAG) bus 432 associated with FPGA 410. JTAG bus 432 may be an interface implementing Institute of Electrical and Electronics Engineers (IEEE) Standard 1149.1-1990, which is a standard specifying an architecture for controlling, testing and monitoring pins of compliant devices on a printed circuit board. It is noted that mechanisms other than a JTAG bus may be utilized in some embodiments to program and/or monitor FPGA 410.

Drive logic block 480 may include one or more signal drivers to drive LUT input signals. In some embodiments, the signals received by LUT 490 may include bi-directional ("bidi") signals, and drive logic block 480 may be configured to drive such bi-directional signals. The value and/or strength of the signals driven by drive logic block 480 may be selected by router 470 (e.g., based on commands or signals received from other nodes) within control logic block 440, as described below in further detail. Sample logic block 485 may include a number of signal samplers that latch the LUT's output signals (which may also include bi-directional signals) and provide the sampled signals to control logic block 440 for further processing.

As shown in FIG. 4, control logic block 440 may include logic for router 470, a formatter 450, and a parser 460. During emulation, LUT 490 may generate output signals that may need to be communicated to other hardware emulators 150, for example where the other hardware emulators are emulating components of the system under test whose behavior is affected by the values of the output signals. As described above, such output signal values may be transmitted as logical signals formatted according to a grammar. Router 470 may be configured to map physical signals, such as output signals sampled with the help of sample logic block 485, to logical signals for transmission to other nodes. That is, a physical representation of a signal may be mapped to a logical representation (which may, for example be associated with any of a designated set of logical ports) by router 470. In addition, router 470 may also be configured to map logical signals received from other nodes to physical signals targeted at LUT 490 (e.g., via driver logic block 480). Outgoing logical signals may be formatted according to the desired grammar using formatter 450. Incoming signals (e.g., signals formatted at, and sent by, other nodes) received at FPGA 410 may be parsed by parser 460 prior to being mapped to physical signals by router 470. In addition, in some embodiments control logic block 440 may also include logic that may perform zero time phase emulation as well as real time phase emulation (described below in further detail), select the specific times at which input are to be driven and output signals are to be sampled, provide status on the emulation in progress, and to provide any other functionality required to control the desired emulation of LUT 490.

As described earlier, CPLD 420 may be used to program FPGA 410 in response to commands issued by DEC 125. DEC 125 may synthesize the desired logic at FPGA 410, for example starting with an HDL representation, or a representation in another high-level language, and in one embodiment may also use one or more tools (such as components of logic synthesis toolkits or development environments) provided by an FPGA vendor to implement the logic synthesis. For hardware emulators 150 incorporated within the same host as DEC 125 (e.g., at hardware emulator 150B in FIG. 2 or hardware emulator 150A in FIG. 1), DEC 125 may issue one or more commands targeted at CPLD 420 using hub 120 and PCI driver 444 to deliver the commands over PCI bus 442. The commands may be received at CPLD 420 via CPLD PCI interface 422. In embodiments where DEC 125 may be on a host other than the targeted hardware emulator 150 (e.g., for hardware emulator 150A in FIG. 3), the command targeted at CPLD 420 may be transmitted from one host to another using any desired network protocol such as the Internet Protocol, prior to being translated to PCI commands (or commands that may be sent over any desired expansion bus 130) at the local host (e.g., by a local hub 220 and/or a local PCI driver associated with a local hub) and received at the targeted CPLD 420. The desired logic may then be programmed or synthesized within FPGA 410 by FPGA programming logic 424, e.g., using JTAG bus 432.

Once the desired logic has been programmed, CPLD 420 may send a message to DEC 125 indicating that the initialization of FPGA 410 has completed. In some embodiments, the role of the CPLD 420 may be restricted to such initial programming and/or bring-up functions; that is, after the FPGA 410 has been appropriately programmed and can begin hardware emulation, CPLD 420 may typically not be used again unless FPGA 410 requires reprogramming. In other embodiments, the use of CPLD 420 may continue during ongoing emulation. In one such embodiment, for example, CPLD 420 may be configured to perform functions similar to part or all of the functions of one or more components of FPGA 410 shown in FIG. 4, such as control logic block 440 and/or FPGA PCI interface 430, thereby allowing the logic of FPGA 410 to be simplified. In another embodiment, CPLD 420 may be configured to periodically monitor the state of FPGA 410 during ongoing emulation. Each hardware emulator 150 within a DDVS 100 may include one or more FPGAs 410 and one or more CPLDs 420 providing functionality generally similar to that described above.

The messages exchanged between different hardware emulators 150 and/or between hardware emulators and hubs 120 or DEC 125 may include any combinations of signals or commands that may be used to control or synchronize emulation of one or more portions of the system under test, or to provide status on the emulation of a portion of the system under test. In some embodiments, "local" messages targeted at other hardware emulators within the same host (i.e., where a message is sent from one hardware emulator 150A at a host 105A to another hardware emulator 150B at host 105A), which may require less processing than "remote" messages targeted at other hosts, may be expedited using special logic or fast-path processing. For example, local messages may not need as much metadata (e.g., network address information) as remote messages, and/or may not require as much formatting as remote messages. Messages between DEC 125 and hub 120 may be sent over sockets provided by an operating system (such as UNIX sockets) in one implementation, as described earlier. Multiple unidirectional or bi-directional sockets may be used, as desired, for communication between hubs 120 and DEC 125 in such embodiments.

In some embodiments, a hardware emulator 150 may be configured to emulate LUT 490 as a series of timesteps. Generally, a timestep is the granule of emulated time by which the hardware emulator 150 advances. For example, in one embodiment each timestep may emulate the operation of the LUT 490 for one nanosecond.

In some embodiments, distributed design verification system 100 may include at least two phases within an emulated timestep: a zero time phase and a real time phase. During the zero time phase, hardware emulators 150, DECs 125, and hubs 120 may communicate with as many commands as desired (including commands which lead to the sampling of output signals of LUTs, and/or changes in the values of input signals of LUTs) while the emulation is frozen. The zero time phase may be used to allow test programs (e.g. executed at a DEC 125) to transmit multiple commands to various hardware emulators 150 and receive replies to those commands without the emulation progressing between the commands. Thus, for example, a first command may be sent to a hardware emulator to read a first signal value. Based on the returned value, the test program may send another command to read a second signal value. Since the emulator is frozen, the state of the second signal value is the same as it was when the first signal value was read (and vice versa). Accordingly, for example, a DEC 125 may assemble state information from multiple hardware emulators 150, or from a single hardware emulator 150, using multiple commands and may be assured that the state returned for each command is consistent with the other state returned for the other commands (since the state of the emulation is frozen). Clock logic included within FPGA 410 may be programmed to remain in a desired (i.e., unchanged) state during a period when hardware emulation is frozen and zero time phase operations are performed, and to resume clock transitions after the zero time phase completes. It is noted that in some embodiments, zero time phase processing may be omitted from a hardware emulator 150. When zero time phase emulation is complete at a particular hardware emulator 150, a message indicative of the completion may be sent to DEC 125. DEC 125 may be configured to ensure that zero time phase emulation has completed at all participating nodes, before sending a command to allow real time phase processing to begin. In some embodiments, a global hub 320 may be configured to control inter-node coordination (e.g., instead of, or in cooperation with, a DEC 125), such as ensuring that zero time phase emulation has completed at all participating nodes before real time phase processing is begun, and/or ensuring that real time phase processing has been completed for one timestep at all participating nodes before initiating processing for the next timestep, etc.

The real time phase may include the sampling and driving of signals from LUTs 490, and may also include time in which the responses to the driven signals are emulated. The real time phase may further include processing of one or more commands received by the hardware emulator 150 (e.g. reading or writing signal values relative to a current state at the LUT 490). The sample and drive of signals (and a subsequent emulation of the LUT 490) may be iterated multiple times within a timestep. The sampling of signals may include reading the signal values from LUT 490 (e.g., using sample logic block 485) and transmitting one or more transmit commands with the sampled signal values. The driving of signals may include receiving one or more transmit commands with driven signal values and applying those signal values to the LUT 490 (e.g., using drive logic block 480). The subsequent emulation of the LUT 490 may determine if the driven signal values cause any changes to signal values within the current timestep (e.g. if the driven signal asynchronously changes an output signal) and may also schedule events for subsequent timestep(s) based on the driven signal values. If any output signals have changed, another phase of sampling and driving may occur. The sampling and driving may be repeated until each hardware emulator 150 does not detect any changes to its output signals in the current timestep, at which time the current timestep may terminate and the next timestep may begin. By iteratively sampling, driving, and emulating the LUT 490, asynchronous signals may be handled within the timestep (if the asynchronous output changes during the timestep). During real time phase processing, router 470 may be configured to map physical signal representations to user-defined logical signals, and vice versa. It is noted that, in one embodiment, the user-defined logical signals may be arranged in user-defined logical ports, and that the routing of signals from node to node may be done on a logical port basis.

Figure 5:
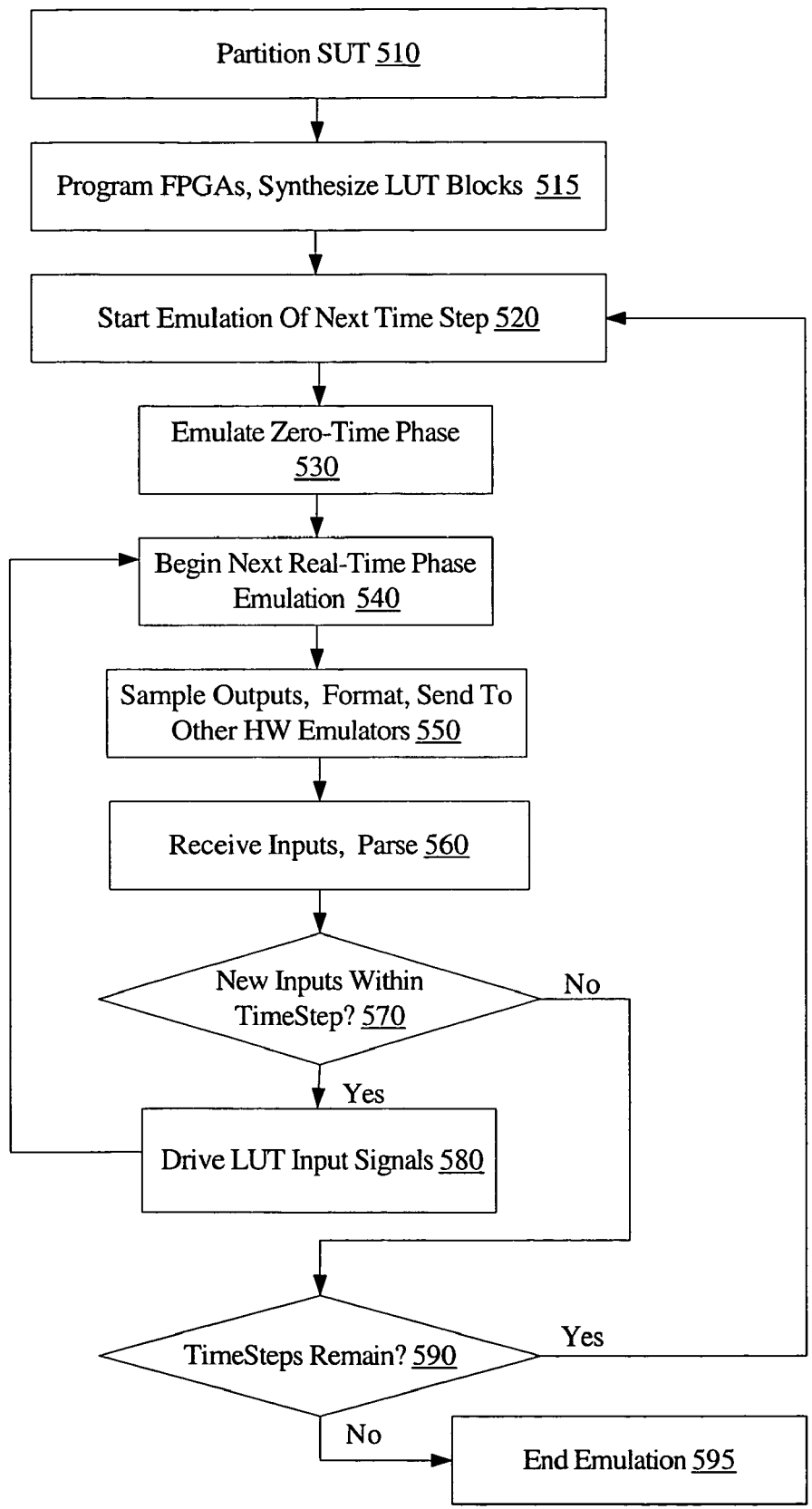
FIG. 5 is a flow diagram illustrating aspects of the operation of a distributed design verification system according to one embodiment.

FIG. 5 is a flow diagram illustrating aspects of the operation of a distributed design verification system 100 according to one embodiment. The illustrated embodiment may be configured to use timestep based emulation as described above. Prior to performing the design verification, the system under test (SUT) may be partitioned into suitable components or portions, each suitable for emulation by a single hardware emulator (block 510). Various different criteria may be used to perform such partitioning in different embodiments; for example, the size of individual partitions may be limited based on logical block or component boundaries, gate count, the processing capabilities of hardware emulators 150, etc. In some embodiments, automated tools may provide suggested partition boundaries based, for example, on some set of specified configurable parameters describing the emulation resources available. In one embodiment, closely related or interconnected portions of the SUT (i.e., portions of the SUT that may require extensive coordination or synchronization messages to be exchanged) may be selected for emulation using the FPGAs at a single host 105, so that inter-host communication is reduced during design verification. That is, in such an embodiment, signal information and/or other commands may be exchanged among different FPGAs 410 of a single host in an expedited manner (e.g., via a PCI bus), without using inter-host networks.

Once the partitions have been decided, the hardware emulators 150 may each be programmed or initialized (block 515). During initialization, for example, emulated logic (e.g., LUTs 490) may be programmed at FPGAs 410, e.g., using CPLDs 420 and JTAG bus 432 as described above. After initialization is complete, the various hardware emulators 150 may begin emulating the first timestep (block 520), for example in response to a command from DEC 125.

As shown, timestep processing for a hardware emulator 150 may begin with a zero time phase emulation at FPGA 410 as described above (block 530). In some embodiments, zero time phase emulation may also result in changes that require iterative emulation steps (not shown in FIG. 5). When emulator zero time phase emulation at a hardware emulator 150 has completed, or if no zero time phase emulation is to be performed at the hardware emulator, in one embodiment the hardware emulator may send a message indicative of such a completion (such as a "NOP" or "No-Op" command formatted in accordance with the grammar described earlier) to DEC 125. In such an embodiment, where DEC 125 is configured to coordinate the phases of a timestep, DEC 125 may be configured to wait until it receives zero time phase completion messages from all hardware emulators 150. After such messages have been received from all participating hardware emulators 150, DEC 125 may be configured to send a message indicating the end of zero time phase processing to the hardware emulators 150 (such as a "ZT_Done" command formatted according to the grammar). As noted above, in some embodiments, hardware emulators may be configured to omit zero time phase emulation (i.e., to skip the step illustrated in block 530), e.g., by immediately sending a message indicating a completion of zero time formatting to DEC 125.

After zero time phase operations have been completed at all participating nodes, hardware emulator 150 may proceed to begin performing real time phase emulation at FPGA 410 (block 540). As described above, during real time phase emulation, certain output signals from LUT 490 may be sampled using sample logic block 485, transformed or translated into a logical signal by router 470, formatted by formatter 450, and sent to one or more additional nodes (block 550). In addition, input signals (e.g., generated at other hardware emulators 150) may be received by control logic block 440 over FPGA PCI interface 430, parsed by parser 460, and transformed from a logical representation to a physical signal representation by router 470 (block 560).

If the value of any of the received input signals for LUT 490 has changed during the timestep (decision block 570), driver logic block 480 within FPGA 410 may apply the input signal value or values to LUT 490 (block 580) and begin another iteration of real time phase emulation (i.e., repeat step 540 and following steps as described above). If no input signal requires further processing within the current timestep, in one embodiment hardware emulator 150 may be configured to send a message indicative of real time emulation completion (e.g., an "RT_Done" command) to DEC 125. When such messages have been received from all hardware emulators 150 participating in the device verification, DEC 125 may be configured to send a message indicating that processing for the next timestep should be initiated to each participating hardware emulator 150. Upon receiving such a message (detected at decision block 590), hardware emulators 150 may proceed to begin processing for the next timestep (i.e., go back to block 520). If no more time steps remain to be emulated, the emulation may be completed (block 595).

Figure 6:
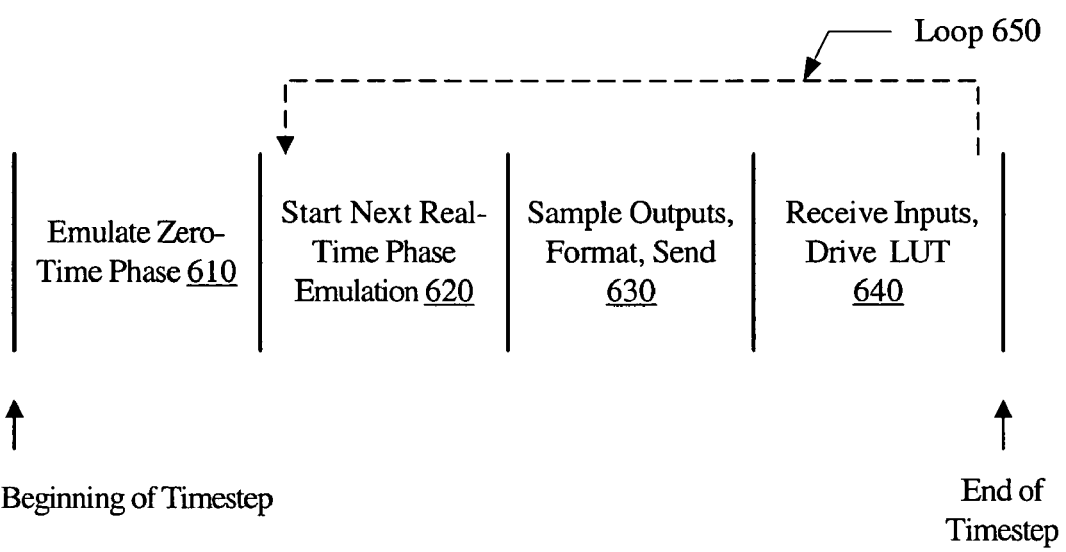
FIG. 6 is a timing diagram of one embodiment of a timestep at a hardware emulator.

FIG. 6 is a timing diagram of one embodiment of a timestep at a hardware emulator 150. In a first period within the illustrated timestep (reference numeral 610), hardware emulator 150 performs zero time phase emulation, as described above. During the next period (reference numeral 620), hardware emulator 150 may start the next real time phase emulation. Output signals from LUT 490 may be sampled, mapped to logical outputs, formatted according to a desired grammar, and sent to other hardware emulation nodes during the following period (reference numeral 630). In a fourth period (reference numeral 640), input signals may be received from other nodes and the input signal values driven to LUT 490. The real time phase emulation steps (reference numerals 620, 630 and 640) may be repeated if signal values change asynchronously, as illustrated by the dotted arrow labeled Loop 650. Once real time phase emulation has completed at all participating nodes, emulation of the next timestep may begin.

It is noted that while hardware emulator 150 was depicted as using a PCI expansion board in some of the embodiments described above, in other embodiments other types of expansion boards (such as PCI-X boards, or proprietary boards) and buses and interconnect technologies (such as PCI-X, proprietary buses, or serializer/deserializer (SERDES) technology) capable of supporting the FPGA and CPLD functionality described above may be employed instead of, or in addition to, PCI boards and buses. In some embodiments, CPLD 420 may be omitted from a hardware emulator, and other techniques (such as direct programming of FPGAs by DEC 125) may be employed to synthesize the desired logic at FPGAs 410. While in some embodiments, each hardware emulator may be mounted at its own exclusive expansion board, in other embodiments a single expansion board may be shared by multiple hardware emulators. In one particular embodiment, software simulation may be combined with hardware emulation: e.g., one or more hosts dedicated to hardware emulation of some portions of the system under test as described above may collaborate with other hosts dedicated to software simulation of other portions of the system under test, and coordinate the combined distributed emulation and simulation using one or more distributed design verification controllers and/or hubs.

It is noted that the functions performed by the various software components or modules shown in FIG. 1, FIG. 2, FIG. 3 and FIG. 4 (e.g., hubs 120, local hubs 220, global hubs 320, PCI driver 444, and DEC 125) may be combined within a single executable program, or distributed among different executables in any combination. Collectively or individually, such software modules may be incorporated within any suitable computer accessible medium. Generally speaking, a computer accessible medium may include any media accessible by a computer during use to provide instructions and/or data to the computer. For example, a computer accessible medium may include storage media such as magnetic or optical media, e.g., disk (fixed or removable), CD-ROM, or DVD-ROM, CD-R, CD-RW, DVD-R, DVD-RW, volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc., as well as media accessible via transmission media or signals such as electrical, electromagnetic, or digital signals, conveyed via a communication medium such as a network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
a first computer host including a first hardware emulator mounted on a first expansion board;
a second computer host including a second hardware emulator mounted on a second expansion board; and
an emulation controller coupled to control the first hardware emulator and the second hardware emulator;
wherein the first hardware emulator is configured to emulate a first portion of a system under test, and the second hardware emulator is configured to emulate a second portion of the system under test, and wherein the first and second hardware emulators are configured to coordinate an emulation of the system under test using one or more messages;
wherein the first hardware emulator includes a first field programmable gate array (FPGA) device;
wherein the second hardware emulator includes a second field programmable gate array (FPGA) device; and
wherein the emulation controller is configured to:
distribute the first portion of the system under test to the first hardware emulator by issuing commands that cause the first FPGA device to be programmed to emulate the first portion under test;
distribute the second portion of the system under test to the second hardware emulator by issuing additional commands that cause the second FPGA device to emulate the second portion under test; and
monitor a state of the first and second hardware emulators during the emulation of the system under test;
wherein the first and second hardware emulators are further configured to emulate the first and second portions, respectively, of the system under test in a series of emulation timesteps, wherein each emulation timestep includes a zero time phase emulation and real time phase emulation, wherein during the zero time phase emulation, a state of an emulation of the respective portion of the system under test is frozen while input signals of the emulation of the respective portion are changed and output signals of the emulation of the respective portion are sampled, and wherein during the real time phase emulation, the state of the emulation of the respective portion of the system under test is iteratively changed in response to sampling output signals of the emulation of the respective portion and driving input signals of the emulation of the respective portion, and wherein the first and second hardware emulators are each configured to generate a corresponding completion message in response to completing the zero time phase emulation;
wherein the emulation controller is configured to cause the first and second hardware emulators to each initiate the real time phase emulation in response to receiving the completion messages from both the first hardware emulator and the second hardware emulator.

2. The system as recited in claim 1, wherein the first computer host further includes one or more additional hardware emulators, wherein each additional hardware emulator is configured to emulate a respective additional portion of the system under test, and wherein each additional hardware emulator is further configured to coordinate the emulation of the system under test with the first and the second hardware emulators using one or more additional messages.

3. The system as recited in claim 1, wherein the first expansion board is a Peripheral Component Interconnect (PCI) board.

4. The system as recited in claim 1, wherein the first hardware emulator includes a complex programmable logic device (CPLD) operable to program the first FPGA in response to the commands.

5. The system as recited in claim 1, wherein the first FPGA device includes a control logic block configured to map a physical representation of an output signal of an emulated portion of the system under test to a logical representation of the output signal.

6. The system as recited in claim 5, wherein the control logic block is further configured to format the logical representation of the output signal according to a grammar.

7. The system as recited in claim 5, wherein the control logic block is further configured to parse an incoming message from the second hardware emulator according to a grammar.

8. The system as recited in claim 1, wherein the first FPGA device includes a drive logic block configured to drive an input signal of an emulation of the first portion of the system under test.

9. The system as recited in claim 1, wherein the first FPGA device includes a sample logic block configured to sample an output signal of an emulation of the first portion of the system under test.

10. The system as recited in claim 1, further comprising a hub, wherein the hub is configured to route the one or more messages.

11. A system comprising:
a first computer host including a first hardware emulator mounted on a first expansion board;
a second computer host including a second hardware emulator mounted on a second expansion board; and an emulation controller coupled to control the first hardware emulator and the second hardware emulator;

a hub;

wherein the first hardware emulator is configured to emulate a first portion of a system under test, and the second hardware emulator is configured to emulate a second portion of the system under test, and wherein the first and second hardware emulators are configured to coordinate an emulation of the system under test by transmitting one or more messages between one another through the hub;

wherein the first hardware emulator includes a first field programmable gate array (FPGA) device and a first programmable logic device (PLD) operable to program the first FPGA device;

wherein the second hardware emulator includes a second field programmable gate array (FPGA) device and a second programmable logic device (PLD) operable to program the second FPGA device;

wherein the emulation controller is configured to:

issue commands that cause the first PLD device to program the first FPGA device to emulate the first portion under test;

issue additional commands that cause the second PLD device to program the second FPGA device to emulate the second portion under test; and monitor a state of the first and second hardware emulators during the emulation of the system under test; and wherein the first and second hardware emulators are further configured to emulate the first and second portions, respectively, of the system under test in a series of emulation timesteps, wherein each emulation timestep includes a zero time phase emulation and real time phase emulation, wherein during the zero time phase emulation, a state of an emulation of the respective portion of the system under test is frozen while input signals of the emulation of the respective portion are changed and output signals of the emulation of the respective portion are sampled, and wherein during the real time phase emulation, the state of the emulation of the respective portion of the system under test is iteratively changed in response to sampling output signals of the emulation of the respective portion and driving input signals of the emulation of the respective portion, and wherein the first and second hardware emulators are each configured to generate a corresponding completion message in response to completing the zero time phase emulation;

wherein the emulation controller is configured to cause the first and second hardware emulators to each initiate the real time phase emulation in response to receiving the completion messages from both the first hardware emulator and the second hardware emulator.

12. The system as recited in claim 11, wherein the first computer host further includes one or more additional hardware emulators, wherein each additional hardware emulator is configured to emulate a respective additional portion of the system under test, and wherein each additional hardware emulator is further configured to coordinate the emulation of the system under test with the first and the second hardware emulators using one or more additional messages.

13. The system as recited in claim 11, wherein the first expansion board is a Peripheral Component Interconnect (PCI) board.

14. The system as recited in claim 11, wherein the first PLD is a complex programmable logic device (CPLD).

15. The system as recited in claim 11, wherein the first FPGA device includes a control logic block configured to map a physical representation of an output signal of an emulated portion of the system under test to a logical representation of the output signal.

16. The system as recited in claim 15, wherein the control logic block is further configured to format the logical representation of the output signal according to a grammar.

17. The system as recited in claim 15, wherein the control logic block is further configured to parse an incoming message from the second hardware emulator according to a grammar.

18. The system as recited in claim 11, wherein the first FPGA device includes a drive logic block configured to drive an input signal of an emulation of the first portion of the system under test.

19. The system as recited in claim 11, wherein the first FPGA device includes a sample logic block configured to sample an output signal of an emulation of the first portion of the system under test.

* * * * *